(12) United States Patent
Cui et al.

(10) Patent No.: US 11,776,625 B2
(45) Date of Patent: Oct. 3, 2023

(54) BOOST-ASSISTED MEMORY CELL SELECTION IN A MEMORY ARRAY

(71) Applicant: Micron Technology, Inc., Boise, ID (US)

(72) Inventors: Mingdong Cui, Folsom, CA (US); Hongmei Wang, Boise, ID (US); Hari Giduturi, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/496,667

(22) Filed: Oct. 7, 2021

(65) Prior Publication Data
US 2023/0115339 A1    Apr. 13, 2023

(51) Int. Cl.
*G11C 13/00* (2006.01)
*G11C 5/14* (2006.01)
*G11C 8/08* (2006.01)

(52) U.S. Cl.
CPC ......... *G11C 13/0038* (2013.01); *G11C 5/145* (2013.01); *G11C 8/08* (2013.01); *G11C 13/0004* (2013.01); *G11C 13/0026* (2013.01); *G11C 13/0028* (2013.01); *G11C 13/0069* (2013.01)

(58) Field of Classification Search
CPC ............ G11C 13/0038; G11C 13/0004; G11C 13/0026; G11C 13/0028; G11C 13/0069; G11C 5/145; G11C 7/12; G11C 8/08; G11C 11/4085
See application file for complete search history.

(56) References Cited

U.S. PATENT DOCUMENTS

| | | | |
|---|---|---|---|
| 6,798,275 B1 * | 9/2004 | Le ......................... | G11C 5/145 327/536 |
| 7,092,308 B2 * | 8/2006 | Choi ...................... | G11C 5/145 365/189.11 |
| 9,928,894 B2 | 3/2018 | Wang et al. | |
| 10,074,415 B2 | 9/2018 | Kawamura et al. | |
| 10,404,161 B2 | 9/2019 | Pan | |
| 2021/0020240 A1 | 1/2021 | Castro et al. | |
| 2022/0189528 A1 * | 6/2022 | Rabe ................... | G11C 11/4076 |

* cited by examiner

*Primary Examiner* — Kretelia Graham
(74) *Attorney, Agent, or Firm* — Greenberg Traurig (57) ABSTRACT

Systems, methods, and apparatus related to selecting memory cells in a memory array of a memory device. In one approach, bias circuitry generates a voltage on an access line used to select a memory cell for programming. During programming, a controller connects a boost capacitor to the access line by controlling a switch. Connecting the boost capacitor causes an increase in the rate of discharge of the access line (e.g., discharge of a word line to a negative voltage). After programming, the controller disconnects the boost capacitor from the access line, and the boost capacitor is pre-charged in preparation for a next programming operation (e.g., on the same or a different memory cell).

27 Claims, 8 Drawing Sheets

FIG. 9

BOOST-ASSISTED MEMORY CELL SELECTION IN A MEMORY ARRAY

FIELD OF THE TECHNOLOGY

At least some embodiments disclosed herein relate to memory devices in general, and more particularly, but not limited to a memory device that uses boost-assisted selection of memory cells in a memory array.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory devices (e.g., FeRAM) may maintain their stored logic state for extended periods of time even in the absence of an external power source. Volatile memory devices (e.g., DRAM) may lose their stored state when disconnected from an external power source.

Memory devices include non-volatile storage devices such as, for example, NAND flash memory devices. NAND flash is a type of flash memory constructed using NAND logic gates. Alternatively, NOR flash is a type of flash memory constructed using NOR logic gates. Currently, the use of NAND flash predominates the flash market.

Typical storage devices have controllers that receive data access requests from host computers and perform programmed computing tasks to implement the requests in ways that may be specific to the media and structure configured in the storage devices. In one example, a flash memory controller manages data stored in flash memory and communicates with a host computing device. In some cases, flash memory controllers are used in solid-state drives (e.g., for use in mobile devices).

Firmware can be used to operate a flash memory controller for a particular storage device. In one example, when a host computer reads data from or writes data to a flash memory device, it communicates with the flash memory controller.

BRIEF DESCRIPTION OF THE DRAWINGS

The embodiments are illustrated by way of example and not limitation in the figures of the accompanying drawings in which like references indicate similar elements.

DETAILED DESCRIPTION

The following disclosure describes various embodiments for a memory device that uses boost-assisted selection of memory cells in a memory array. At least some embodiments herein relate to non-volatile memory devices that implement a memory array using a cross-point architecture. The memory device may, for example, store data used by a host device (e.g., a computing device of an autonomous vehicle, or a computing device of a control system for various industrial or consumer equipment). In one example, the memory device is a solid-state drive mounted in an electric vehicle.

Some cross-point memory devices use memory cells that require a high voltage be applied to select a particular memory cell in the memory array. For example, a memory cell using chalcogenide as a storage element requires a high voltage across its two electrodes in order to snap the cell, which changes the memory cell from an off state to an on state. However, when the cell snaps, a high current can flow through the cell. This can damage the cell and/or degrade its reliability.

To avoid such high current, a current mirror is sometimes used in the circuit path for the access line used to select the cell. Although the current mirror can limit current when the cell snaps so as to avoid this damage or degradation, the current mirror also limits the current for discharging the access line in order to select the cell. This limiting of the current causes the technical problem of a significant delay in discharging the access line to select the cell. This delay is caused by the large parasitic capacitance associated with one or both of the selection circuitry used to select the memory cell and/or the access line itself. This limited discharge current is only able to slowly discharge the parasitic capacitance. The selection circuitry includes various components such as decoders that can contribute to parasitic capacitance. The access line includes numerous non-selected memory cells and other memory array components that also contribute to the parasitic capacitance.

The delay in discharging the access line due to using the current mirror above requires a longer time period to snap the memory cell. This increased access time slows down performance of the memory device. For example, this delay in discharge makes bit line or word line ramping significantly slow such that the memory cell is snapped (selected) late. For example, in a typical design it can take more than 30 nanoseconds to ramp those cells in the array that are most difficult to snap (e.g., due to having a higher threshold voltage, etc.).

In one example of the above technical problem, a current mirror used in a cross-point memory device provides a constant current (e.g., 10-50 microamps) for discharging a word line. The current is fixed in value due to various concerns about the memory device (e.g., excessive energy consumption, stress on the memory cells, etc.). The current cannot be significantly increased due to these concerns. Thus, this causes the technical problem of slow performance due to access delay as discussed above.

Various embodiments of the present disclosure provide a technological solution to the above technical problems by providing a boost capacitor used to boost a voltage on an access line when selecting a memory cell. In one embodiment, each access line in a memory array is normally discharged during access operations (e.g., read or write) by using a current mirror. The boost capacitor is electrically connected by a switch at controlled times (e.g., the decision whether to use the boost and/or the specific timing characteristics of the boost are determined by a controller based on the specific memory cell(s) being programmed, etc.) to an access line being used to select a memory cell so that the voltage is boosted (e.g., a negative or positive voltage boost). In one example, the voltage is boosted when programming the cell. In one example, the voltage is boosted when reading the cell. In one example, the voltage is boosted so that the rate of discharge of the access line is significantly greater than the rate of discharge that is achievable by the current mirror alone.

In one embodiment, a cross-point memory device includes bias circuitry configured to generate a voltage on an access line used to access a memory cell of a memory array. At least one capacitor is configured to boost the voltage on the access line when accessing the memory cell. At least one switch is configured to electrically connect the capacitor to the bias circuitry. The switch is in an on state when the capacitor is boosting the voltage. Pre-charging circuitry is configured to pre-charge the capacitor after performing a boost operation. The switch is in an off state when the capacitor is being pre-charged in preparation for boosting the voltage (e.g., in response to a subsequent read or write command received by a controller).

In one example, the bias circuitry generates the voltage on a word line during a write operation. The voltage generated is a negative voltage. The voltage is negative, for example, relative to a ground voltage (e.g., zero volts) or other reference voltage of the memory device. In one example, the voltage of the word line is initially discharged by a current mirror at the start of the write operation. After the write operation has begun (e.g., at least 2 to 10 nanoseconds later), the switch connects a boost capacitor to the bias circuitry. The boost capacitor significantly increases the rate of discharge of the word line by pulling charge from the word line in parallel with the discharge occurring by the current mirror. After the memory cell is selected (e.g., a chalcogenide cell snaps), the switch disconnects the capacitor, and the pre-charging circuitry pre-charges the capacitor in preparation for the next access operation.

In one example, timing control logic is used to determine the time at which the switch connects the boost capacitor to the access line. In one example, the timing control logic is implemented using a controller which provides a boost signal to the switch. In one example, the cell selection time required for a write operation is reduced by at least 30 to 50 percent when using the boost. In one example, the memory array and the controller are on the same semiconductor die. In one example, the voltage is boosted by at least 200 millivolts greater than the voltage that would have been achieved (by using the same time duration) without use of the boost capacitor.

In one example, in preparation for generating a negative voltage on a word line, the boost capacitor is pre-charged to at least negative 2-4 volts as measured across the terminals of the capacitor. This permits the boost capacitor to quickly discharge the parasitic capacitances on the memory cell selection circuit path.

Various advantages for boost selection are provided by embodiments described herein. In one advantage, a typical 30 nanosecond selection time can be reduced to 10-15 nanoseconds, which can provide a significant 10 percent or greater improvement of write completion time. In one advantage, by using the above boost selection, both low threshold voltage and high threshold voltage cells snap more consistently at a similar time (e.g., all cells snap within a shorter time period, or within a narrower time window), so that their program pulse shapes are more similar to one another. This helps, for example, to support reliable operation for memory cells using multiple levels of data storage in each cell (e.g., TLC, QLC) as the behavior of each memory cell is more similar.

Figure 1:
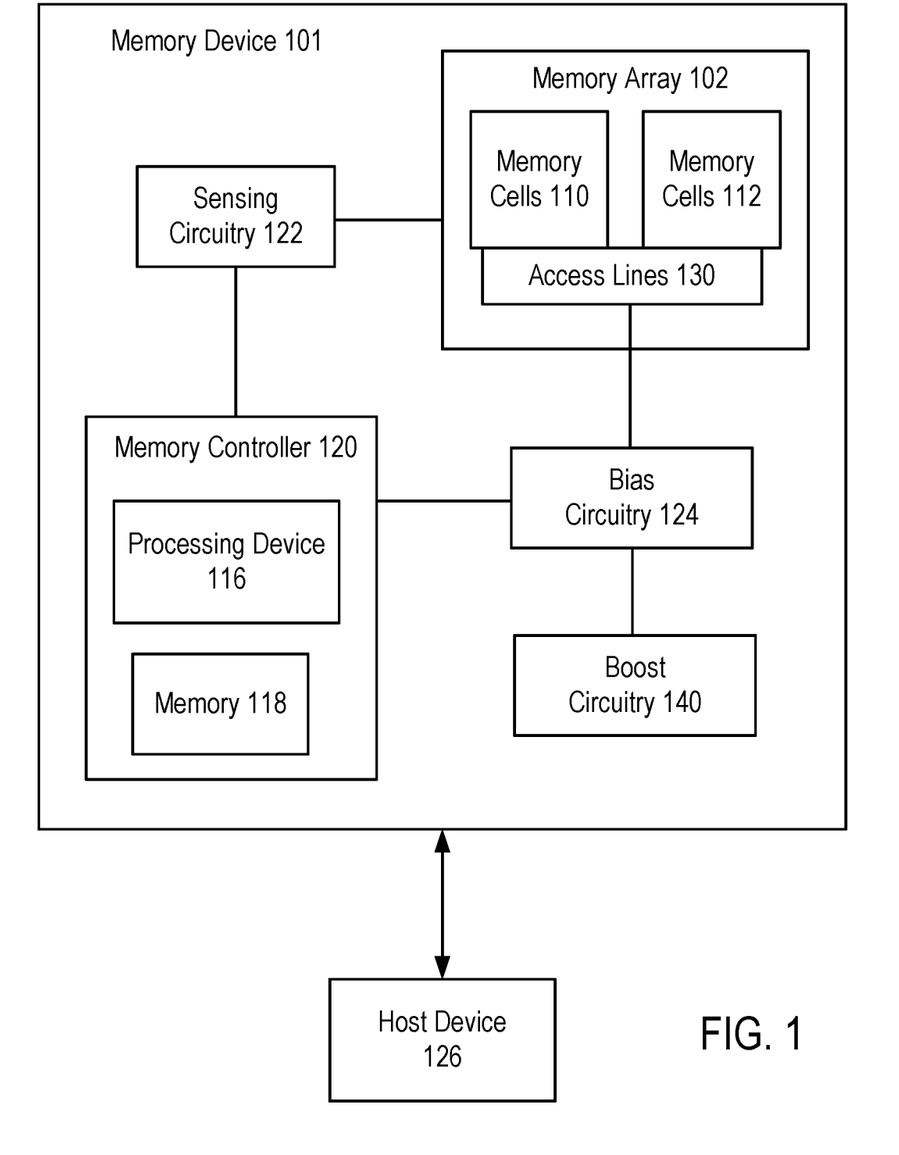
FIG. 1 shows a memory device that boosts write voltages applied to memory cells in a memory array when performing write operations, in accordance with some embodiments.

FIG. 1 shows a memory device 101 that boosts write voltages applied to memory cells 110, 112 in a memory array 102 when performing write operations, in accordance with some embodiments. Memory device 101 includes memory controller 120, which controls sensing circuitry 122 and bias circuitry 124. Memory controller 120 includes processing device 116 and memory 118. In one example, memory 118 stores firmware that executes on processing device 116 to perform various operations for memory device 101. In one example, the operations include reading and writing to memory cells 110, 112 of memory array 102. In one example, memory cells 110 are located in a left half tile and memory cells 112 are located in a right half tile of the memory array.

Access lines 130 of memory array 102 are used to access memory cells 110, 112. In one example, access lines 130 are word lines and/or bit lines. In one example, each access line 130 is split in a central region (e.g., the middle of the access line) to have a left portion that accesses memory cells 110 and a right portion that accesses memory cells 112.

Bias circuitry 124 is used to generate voltages on access lines 130. In one example, vias are used to electrically connect access lines 130 to bias circuitry 124. In one example, a single via is used to electrically connect a left portion and a right portion of each access line 130 to a word or bit line driver of bias circuitry 124.

In one example, a voltage is generated on access line 130 to access a memory cell 110. In one example, the voltage is driven as part of a read or write operation performed in response to a command received from host device 126.

Boost circuitry 140 is used to boost the voltage on one of access lines 130 when accessing a memory cell 110, 112. In one embodiment, boost circuitry 140 connects one or more boost capacitors to bias circuitry 124 during an access operation. In one embodiment, boost circuitry 140 is controlled by memory controller 120. In one embodiment, boost circuitry 140 is used to boost the voltage on both of the access lines (e.g., a word line and a bit line) that are used to access a memory cell.

In one embodiment, boost circuitry 140 is controlled by bias circuitry 124. For example, a condition or state determined by bias circuitry 140 triggers use of boost circuitry 140.

Sensing circuitry 122 is used to sense current flowing through memory cells 110, 112. In one example, sensing circuitry 122 senses a current that results from applying a voltage to a memory cell 110 during a read operation.

In one embodiment, memory device 101 selects write voltages for applying to memory cells 110, 112 when performing write operations. In one embodiment, use of boost circuitry 140 is based on the write voltage selected (e.g., as determined by memory controller 120).

In one embodiment, bias circuitry 124 is implemented by one or more voltage drivers. Bias circuitry 124 may be used to generate read voltages for read operations performed on memory array 102 (e.g., in response to a read command from host device 126).

In one embodiment, sensing circuitry 122 is used to sense a state of each memory cell in memory array 102. In one example, sensing circuitry 122 includes current sensors (e.g., sense amplifiers) used to detect a current caused by applying various read voltages to memory cells in memory array 102. Sensing circuitry 122 senses a current associated with each of the memory cells 110 caused by applying the voltage.

In one example, if sensing circuitry 122 determines that the respective current resulting from applying a read voltage to the memory cell is greater than a respective fixed threshold (e.g., a predetermined level of current or threshold current), then memory controller 120 determines that the memory cell has snapped.

In one embodiment, memory cells 110, 112 can be of different memory types (e.g., single level cell, or triple level cell).

In one embodiment, memory controller 120 receives a write command from a host device 126. The write command is accompanied by data (e.g., user data of a user of host device 126) to be written to memory array 102. In response to receiving the write command, controller 120 initiates a programming operation by applying voltages to memory cells 110. In one embodiment, controller 120 determines respective currents resulting from applying the voltages. In one embodiment, controller 120 provides timing signals to switches, which are used to cause various circuitry to control the currents for memory cells. In one example, local data sensing and/or processing circuitry is used to determine cell current and/or data logic for individual memory cells.

In one embodiment, controller 120 determines whether the existing programming state (e.g., logic state zero) and the target programming state (e.g., logic state zero) for each cell are equal. If the existing and target programming states are equal, then no write voltage is applied (e.g., this is a normal write mode). If the existing and target programming states are different, then a write voltage is applied to that particular memory cell. In one example, the write voltage is 3-8 volts applied across the memory cell by applying voltage biases to the word line and bit line used to select the cell.

In one example, controller 120 may use write voltages (e.g., write pulses) to write a logic state to a memory cell, such as memory cell 110, 112 during the write operation. The write pulses may be applied by providing a first voltage (e.g., a positive voltage) to a bit line and providing a second voltage (e.g., a negative voltage) to a word line to select the memory cell. Circuits electrically connected to access lines to which memory cells may be electrically connected can be used to provide the write voltages (e.g., access line drivers included in decoder circuits). The circuits may be controlled by internal control signals provided by a control logic (e.g., controller 120). The resulting voltage applied to the memory cell is the difference between the first and second voltages.

In one embodiment, the memory cell has one or more physical properties that are changed to correspond to different logic states. In one example, the changed physical property relates to atomic structure. In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

Figure 2:
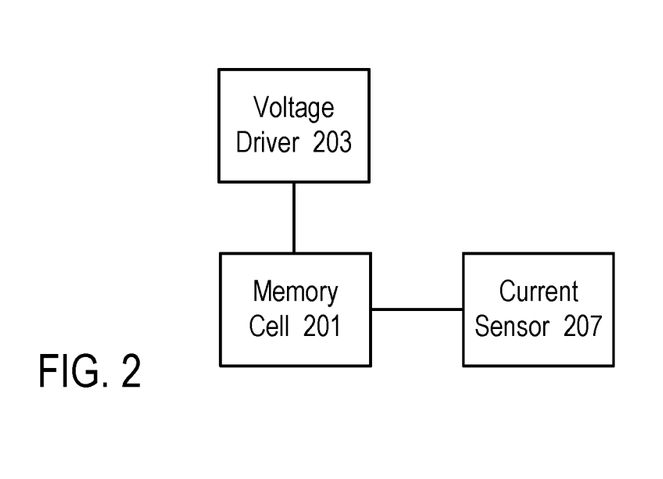
FIG. 2 shows a voltage driver that drives a voltage profile applied to a memory cell, in accordance with some embodiments.

FIG. 2 shows a voltage driver 203 that drives a voltage applied to a memory cell 201, in accordance with some embodiments. Voltage driver 203 is configured to drive up or down the voltage applied on an access line to select the memory cell 201 during a read or write operation. In one embodiment, voltage driver 203 is implemented by multiple voltage drivers. In one example, a portion of the voltage drivers are bit line drivers, and another portion of the voltage drivers are word line drivers. In one example, voltage drivers 203 are included in bias circuitry 124. Memory cell 201 is an example of memory cell 110, 112.

In one example, when a sensing voltage is applied to memory cell 201, current sensor 207 determines a current resulting from applying the sensing voltage. In one example, voltage drivers 203 apply the sensing voltage by driving a bit line to a positive voltage, and a word line to a negative voltage. Current sensor 207 is an example of sensing circuitry 122.

In one example, after applying the voltage, when the voltage applied on the memory cell 201 is above the threshold voltage of a programmed cell, the current sensor 207 is configured to determine whether or not the memory cell 201 is conductive, based on the current going through the memory cell 201. If the current sensor 207 detects an amount of current corresponding to a programmed cell, the memory cell 201 is determined to have been programmed to be a SET cell to have a low voltage threshold (corresponding to data that is different from the data represented by a RESET cell that has a high voltage threshold). If the current sensor 207 does not detect the amount of current corresponding to a programmed cell, the memory cell is determined to be a reset cell that corresponds to predetermined data represented by having high voltage thresholds (e.g., cells that have not yet been programmed after a reset or erase operation, or cells that have been programmed to have a high voltage threshold).

Figure 3:
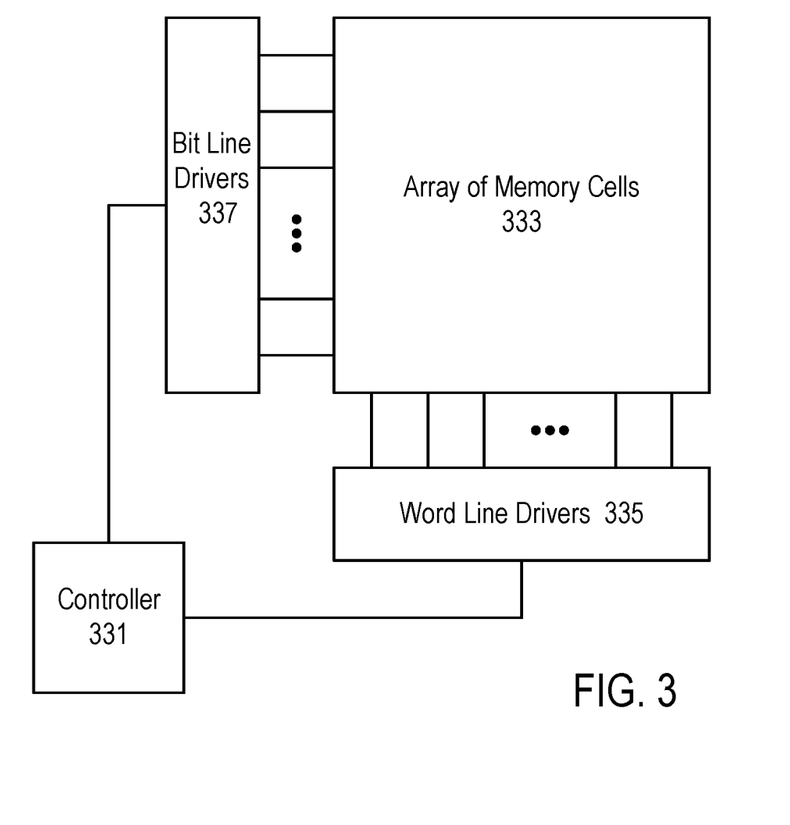
FIG. 3 shows a memory device configured with drivers to drive voltages on access lines to select memory cells in a memory array, in accordance with some embodiments.

FIG. 3 shows a memory device configured with drivers 335, 337 to drive voltages on access lines to select memory cells in a memory array 333, in accordance with some embodiments. For example, memory cell 201 illustrated in FIG. 2 can be used in the memory array 333.

The memory device of FIG. 3 includes a controller 331 that operates bit line drivers 337 and word line drivers 335 to access the individual memory cells (e.g., cell 201) in the memory array 333. Controller 331 is an example of memory controller 120. Memory array 333 is an example of memory array 102.

The bit line drivers 337 and/or the word line drivers 335 can be implemented by voltage drivers 203 as illustrated in FIG. 2. In one example, each memory cell (e.g., 201) in the array 333 can be accessed via voltages driven by a pair of a bit line driver and a word line driver, as illustrated in FIG. 4.

Figure 4:
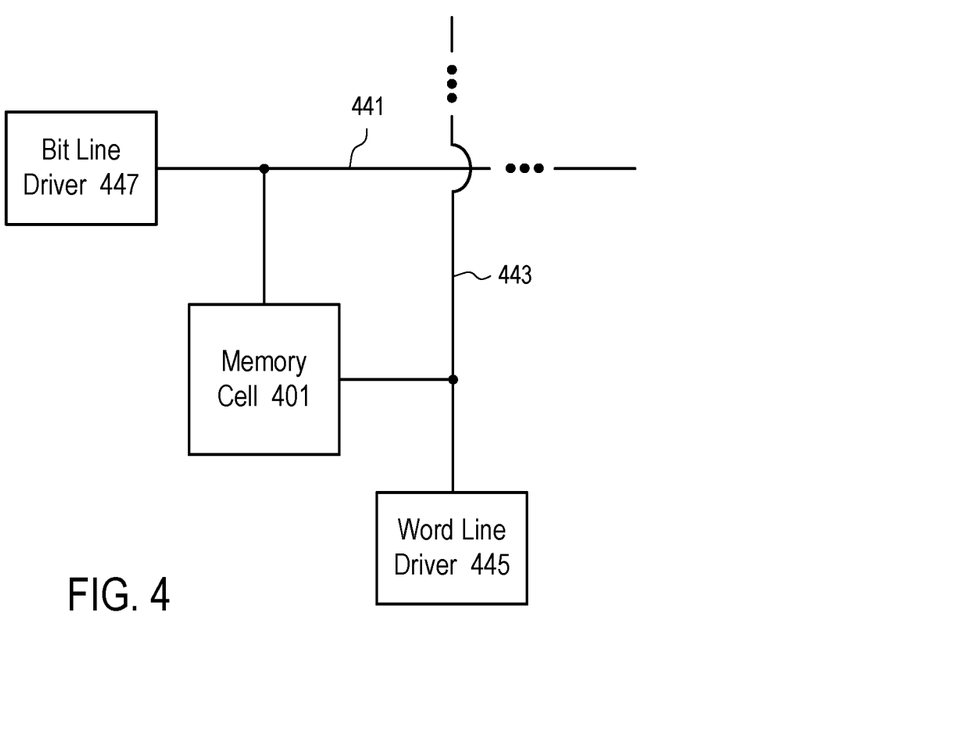
FIG. 4 shows a memory cell with a bit line driver and a word line driver configured to generate voltages on access lines, in accordance with some embodiments.

FIG. 4 shows a memory cell 401 with a bit line driver 447 and a word line driver 445 configured to generate voltages on access lines 441, 443, in accordance with some embodiments. For example, bit line driver 447 drives a first voltage applied to a row of memory cells in the array 333; and word line driver 445 drives a second voltage applied to a column of memory cells in the array 333. A memory cell 401 in the row and column of the memory cell array 333 is subjected to the voltage difference between the first voltage driven by the bit line driver 447 and the second voltage driven by the word line driver 445. When the first voltage is higher than the second voltage, the memory cell 401 is subjected to one voltage polarity (e.g., positive polarity); and when the first voltage is lower than the second voltage, the memory cell 401 is subjected to an opposite voltage polarity (e.g., negative polarity).

For example, when the memory cell 401 is configured to be read with positive voltage polarity, the bit line driver 447 can be configured to drive a positive voltage. For example, when the memory cell 401 is configured to be read with negative voltage polarity, the word line driver 445 can be configured to drive a positive voltage.

For example, during a write operation, both the bit line driver 447 and the word line driver 445 can drive voltages of differing magnitudes (e.g., to perform read and write steps). For example, the bit line driver 447 can be configured to drive a positive voltage with differing magnitudes; and the word line driver 445 can be configured to drive a negative voltage with differing magnitudes. The difference between the voltage driven by the bit line driver 447 and the voltage driven the word line driver 445 corresponds to the voltage applied on the memory cell 401.

In one example, the bit line drivers 337 can be used to drive access lines (e.g., parallel wires) (e.g., 441) arranged in one direction and disposed in one layer of cross-point memory; and the word line drivers 435 can be used to drive access lines (e.g., parallel wires) (e.g., 443) arranged in another direction and disposed in another layer of the cross-point memory. For example, the wires (e.g., 441) connected to the bit line drivers (e.g., 447) and the wires (e.g., 443) connected to the word line drivers (e.g., 445) run in the two layers in orthogonal directions. The memory cell array 333 is sandwiched between the two layers of wires; and a memory cell (e.g., 401) in the array 333 is formed at a cross point of the two wires (e.g., 441 and 443) in the integrated circuit die of the cross-point memory.

Figure 5:
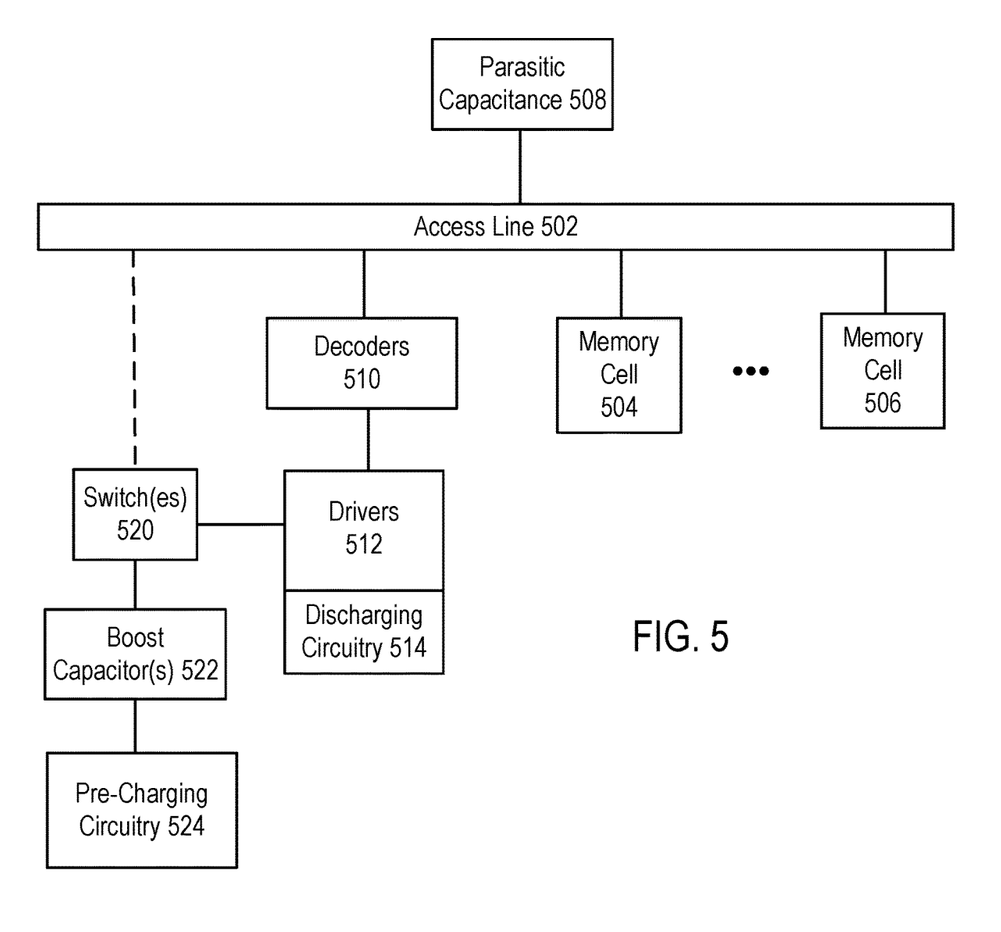
FIG. 5 shows one or more boost capacitor(s) used to boost a voltage on an access line when selecting a memory cell in a memory array, in accordance with some embodiments.

FIG. 5 shows one or more boost capacitor(s) 522 used to boost a voltage on an access line 502 when selecting a memory cell 504, 506 in a memory array, in accordance with some embodiments. In one example, boost capacitor 522 is included in boost circuitry 140 of FIG. 1. In one example, memory cells 504, 506 are included in memory array 102. Access line 502 is an example of access line 130.

One or more switch(es) 520 electrically connect boost capacitor 522 to drivers 512. In some embodiments, one or more of boost capacitors 522 can additionally and/or alternatively be electrically connected to access line 502 directly without passing through drivers 512. In one example, each access line 502 (or each group of access lines 502) is boosted by a different boost capacitor 522.

In one embodiment, switch 520 connects boost capacitor 522 to drivers 512 during a write operation. Discharging circuitry 514 is used to discharge access line 502 during the write operation. In one example, discharging circuitry 514 includes one or more current mirrors used to pull down the voltage of access line 502 to a negative voltage. Discharging circuitry 514 is activated during the write operation. Switch 520 connects boost capacitor 522 to drivers 512 after discharge circuitry 514 has been activated.

Pre-charging circuitry 524 is electrically connected to boost capacitor 522 and pre-charges boost capacitor 522 after boost capacitor 522 has been used to boost access line 502. In one example, pre-charging circuitry 524 removes charge from boost capacitor 522 in preparation for a next write operation in which access line 502 (e.g., a word line) will be pulled down to a negative voltage (e.g., −3 volts).

In one embodiment, switch 520 is switched on (on state) and off (off state) in response to a control signal provided by a controller (not shown). In one example, the controller is memory controller 120. In one example, the control signal (e.g., the boost signal of FIG. 6) is provided in response to the controller receiving a read or write command from a host device.

Drivers 512 generate voltages on various access lines, including access line 502. Drivers 512 are connected to the access lines by decoders 510. Decoders 510 are used to select access line 502 when memory cell 504, 506 is to be selected for a read or write operation (and/or another operation of a memory device).

Memory cell 504 is electrically closer to drivers 512 than memory cell 506. Memory cell 504 is sometimes referred to herein as a near memory cell because the electrical distance from the memory cell 504 to the driver 512 used to generate a voltage on access line 502 for selecting memory cell 504 is less than the electrical distance from the memory cell 506 to the driver 512.

Parasitic capacitance 508 includes various parasitic capacitances associated with the circuit path from drivers 512 to memory cell 504, 506. Parasitic capacitance 508 may include parasitic capacitance associated with access line 502 and/or decoders 510. Typically, the parasitic capacitance 508 significantly increases the time required for discharge of access line 502 by discharging circuitry 514 alone. The use of boost capacitor 522 significantly reduces this discharge time.

Boost capacitor 522 can be implemented using various physical structures. For example, boost capacitor 522 can be a gate oxide capacitor, a metal-to-metal capacitor, or a metal insulator metal (MIM) capacitor. In one example, boost capacitor 522 is formed as part of CMOS circuitry in a semiconductor substrate on which a memory array is formed.

Boost capacitor 522 can be positioned at various locations in a memory device that includes access line 502. In one example, boost capacitor 522 is formed as part of CMOS circuitry that includes drivers 512. In one example, boost capacitor 522 is located in a semiconductor substrate on which a cross-point memory array is formed overlying the substrate. In one example, pre-charging circuitry 524 is formed as part of the CMOS circuitry that includes boost capacitor 522.

Figure 6:
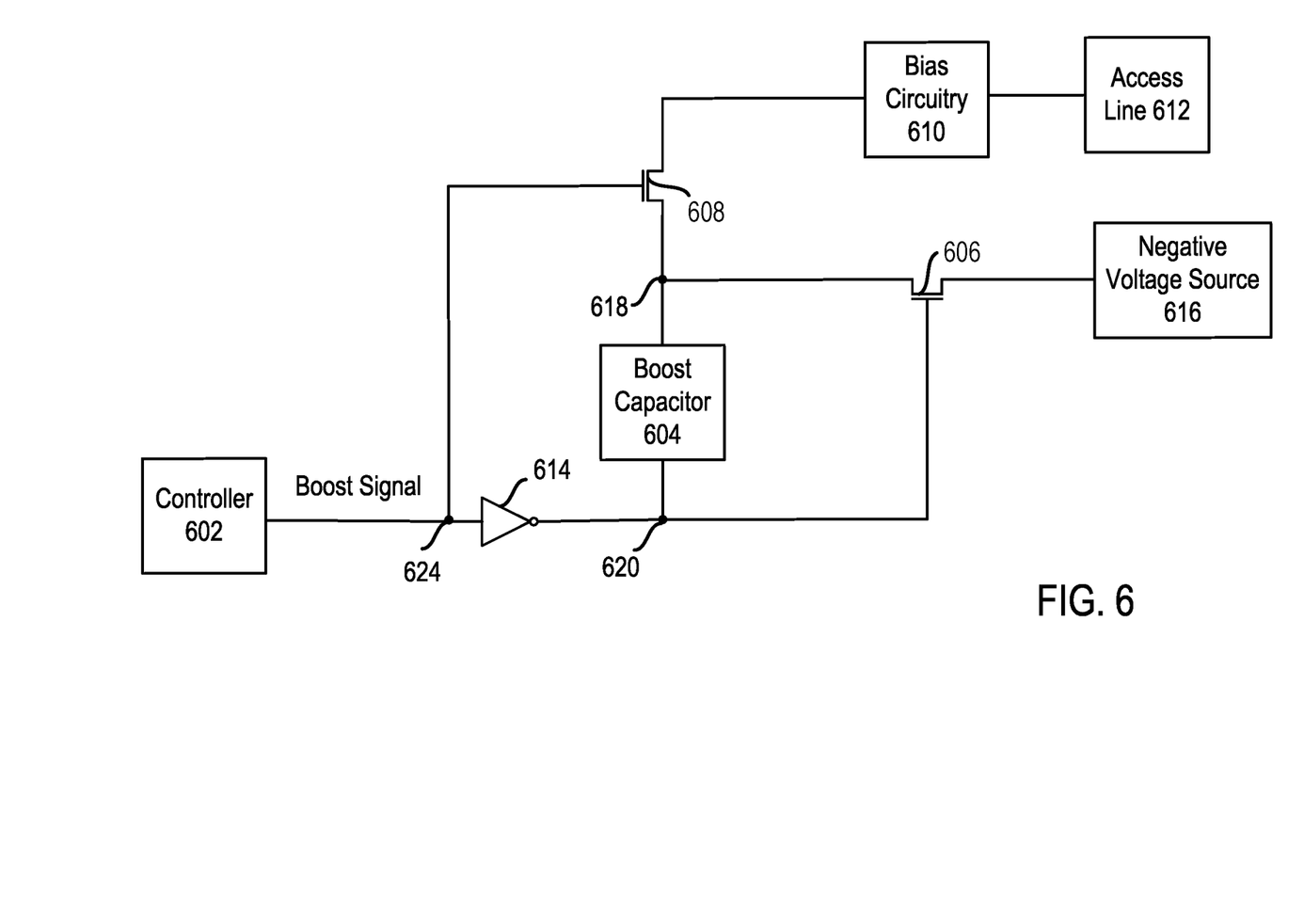
FIG. 6 shows a system including boost circuitry controlled by a controller and used to boost a voltage on an access line, in accordance with some embodiments.
Figure 8:
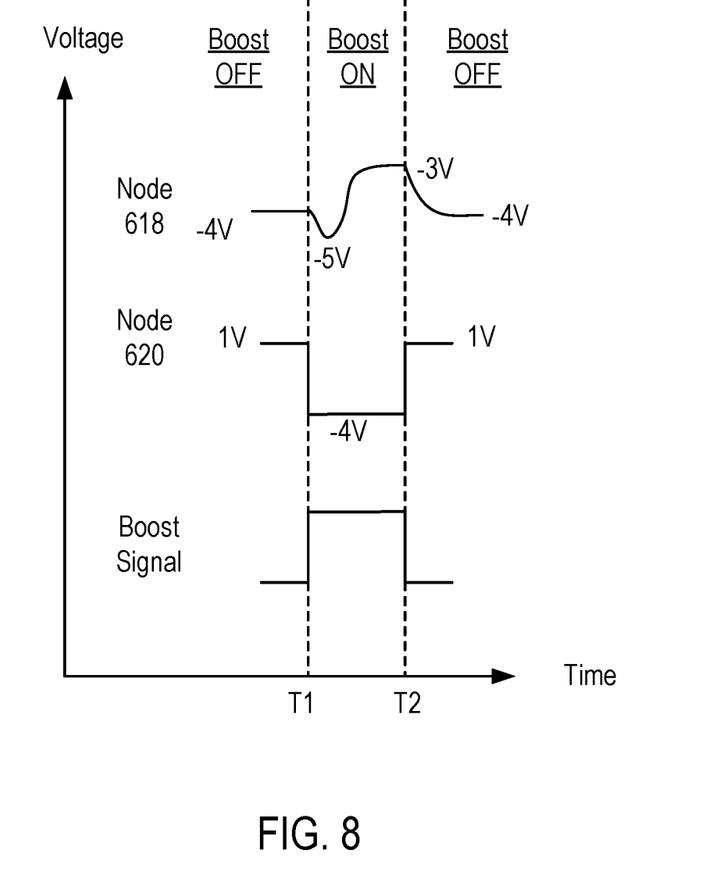
FIG. 8 shows exemplary voltage waveforms for the system of FIG. 6, in accordance with some embodiments.

FIG. 6 shows a system including boost circuitry controlled by a controller 602 and used to boost a voltage on an access line 612, in accordance with some embodiments. In one example, the boost circuitry is boost circuitry 140 of FIG. 1. The boost circuitry of FIG. 6 includes boost capacitor 604 and switch 608. The boost circuitry further includes pre-charging circuitry (e.g., pre-charging circuitry 524) having a switch 606 and negative voltage source 616. The boost circuitry of FIG. 6 is controlled by a boost signal provided from controller 602. The boost signal is inverted by inverter 614 to provide an output signal that controls pre-charging of boost capacitor 604 (e.g., by turning on switch 606). The output of inverter 614 also switches when boosting the access line (e.g., switches the voltage of node 620 lower, such as illustrated in FIG. 8).

Boost capacitor 604 is an example of boost capacitor 522. Switch 608 is an example of switch 520. Controller 602 is an example of memory controller 120. In one example, switch 608 and/or switch 606 are implemented as MOS field-effect transistors (MOSFETs).

In one example, boost capacitor 604 has a capacitance of 10 to 150 femtoFarads (fF) and is used for a single bit line or word line. In one example, boost capacitor 604 provides a voltage boost of at least 300 mV in less than 5 nanoseconds (ns) for a word line. In one example, a 60 fF boost capacitor provides a voltage boost of 650 mV for a word line.

Bias circuitry 610 generates a voltage on access line 612. In one example, the voltage is generated during a read or write operation. During the read or write operation, switch 608 electrically connects boost capacitor 604 to bias circuitry 610 to boost the voltage on access line 612. Bias circuitry 610 is an example of bias circuitry 124. Access line 612 is an example of access line 502.

The boost signal from controller 602 is provided at node 624 and used to turn switch 608 on and off. The boost signal also provides an input to inverter 614. The output of inverter 614 is connected to node 620 and provides a signal to turn switch 606 on and off for controlling pre-charging of boost capacitor 604.

In one embodiment, switch 606 is turned on to electrically connect negative voltage source 616 to node 618 when pre-charging boost capacitor 604. Negative voltage source 616 pre-charges boost capacitor 604 through switch 606. In one example, negative voltage source 616 pulls node 618 down to a negative voltage (e.g., −4 volts) in preparation for an upcoming boost operation.

It should be noted that although access line 612 is described for FIG. 6 as being discharged to a negative voltage, in other embodiments access line 612 can be charged to a positive voltage. In such case, boost capacitor 604 is used to boost the voltage of access line 612 to a positive voltage. In this alternative case, voltage source 616 is a positive voltage source that pulls node 618 up to a positive voltage during pre-charging.

In one embodiment, during operation of a memory device, controller 602 receives various commands from a host device (e.g., host device 126). These commands include read and/or write commands. In one example, controller 602 receives a write command. In response to receiving the write command, the controller causes bias circuitry 610 to generate a voltage on access line 612. The voltage is generated, for example, to program a memory cell selected using access line 612.

After the bias circuitry has begun generating the voltage on access line 612, controller 602 changes a state of the boost signal from inactive (boost off) to active (boost on). The active state of the boost signal causes switch 608 to electrically connect boost capacitor 604 to bias circuitry 610. This boosts the voltage on the access line 612 (e.g., as described above for FIG. 5). The voltage on the access line 612 is discharged by boost capacitor 604 to a negative voltage sufficient to program the selected memory cell.

After the memory cell is programmed, boost capacitor 604 is pre-charged. Controller 602 causes the boost signal to transition from an active state (boost on) to an inactive state (boost off). In this boost-off state, the boost signal is inverted by inverter 614 to provide a signal at node 620 that causes switch 606 to turn on, which electrically connects negative voltage source 616 to node 618. This causes charge be removed from node 618 so that boost capacitor 604 is pre-charged in preparation for boosting the voltage on access line 612 when a subsequent read and/or write command is received by controller 602.

In one example, after boost capacitor 604 has been pre-charged, the voltage on node 618 is less than −3 volts (e.g., −4V), and the voltage on node 620 is greater than zero volts (e.g., 1V).

Figure 7:
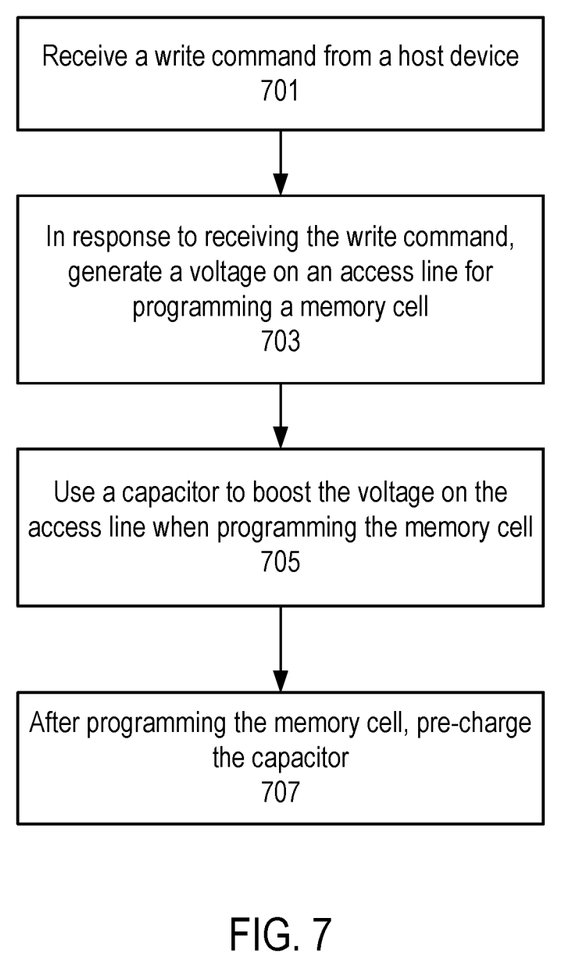
FIG. 7 shows a method for boosting a voltage on an access line when programming a memory cell, in accordance with some embodiments.

FIG. 7 shows a method for boosting a voltage on an access line when programming a memory cell, in accordance with some embodiments. For example, the method of FIG. 7 can be implemented in the system of FIG. 1. In one example, the access line is access line 502 or access line 612, and the voltage is boosted by boost capacitor 522 or boost capacitor 604.

The method of FIG. 7 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 7 is performed at least in part by one or more processing devices (e.g., processing device 116 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 701, a write command is received from a host device. In one example, the write command is received by memory controller 120 from host device 126.

At block 703, in response to receiving the write command, a voltage is generated on an access line for programming a memory cell. In one example, the voltage is generated on access line 612 by bias circuitry 610.

At block 705, a capacitor is used to boost the voltage on the access line when programming the memory cell. In one example, the capacitor is boost capacitor 604.

In one example, a word line is discharged when selecting a memory cell. Prior to connecting a boost capacitor to the access line, discharging circuitry 514 has discharged the access line to a voltage of −2V. Then, the boost capacitor is connected to the access line to boost the rate of discharge of the access line. The access line is discharged to a final negative voltage sufficient for programming the memory cell (e.g., −3V).

At block 707, after programming the memory cell, the capacitor is pre-charged. In one example, boost capacitor 604 is pre-charged using negative voltage source 616.

In one embodiment, a method comprises: receiving, by a controller (e.g., 602), a write command; in response to receiving the write command, causing, by the controller, bias circuitry (e.g., 610) to generate a voltage on an access line (e.g., 612), wherein the access line is configured to program a memory cell (e.g., 110, 112, 504, 506) of a memory array; boosting, using a capacitor (e.g., 522, 604), the voltage on the access line when programming the memory cell; and after programming the memory cell, pre-charging the capacitor.

In one embodiment, the method further comprises: receiving, by the controller, an address associated with the write command; and determining, using the address, a physical location of the memory cell (e.g., a physical location of the memory cell in memory array 102). Boosting the voltage on the access line is performed based on the determined physical location (e.g., a physical address determined from a logical address received from a host device).

In one embodiment, boosting the voltage can be based on an electrical distance of a memory cell from a driver used to select the memory cell. In one example, a controller reads a mapping table that maps physical or logical address to an electrical distance of a memory cell when deciding whether to boost an access line.

In one embodiment, one and/or both access lines can be selectively boosted. In one embodiment, a controller decides whether to boost one or both of the access lines. In one embodiment, the decision to boost is based at least in part on a temperature of the memory device determined by a temperature sensor of the memory device.

In one example, controller 602 determines based on a physical or logical address that a memory cell is a near memory cell (e.g. 504). Because the memory cell is a near memory cell (the electrical distance to driver 512 is relatively short), controller 602 determines not to boost the voltage on the access line.

In one example, controller 602 determines based on the physical or logical address that the memory cell is a far memory cell (e.g., 506). Because memory cell is a far memory cell (the electrical distance to driver 512 is relatively long as compared to the electrical distance from near memory cell 504 to driver 512), controller 602 determines to boost the voltage on the access line.

In one example, controller 602 determines whether to boost an access line based on a user command (e.g., a second try). In one example, controller 602 determines whether to boost an access line based on a counter (e.g., a cycle count such as a number of read and/or write cycles exceeding a threshold count value).

In one embodiment, a switch (e.g., 608) is configured to electrically connect the capacitor to the bias circuitry; the switch is in an on state when the capacitor is boosting the voltage; the switch is in an off state when the capacitor is being pre-charged; and causing the capacitor to boost the voltage comprises changing the switch from the off state to the on state.

In one embodiment, a first terminal of the capacitor (e.g., the terminal of boost capacitor 604 connected to node 618) is electrically connected to the switch, and a second terminal of the capacitor (e.g., the terminal of boost capacitor 604 connected to node 620) is coupled to a control signal (e.g., the boost signal as illustrated in FIG. 6) provided by the controller (e.g., controller 602 through inverter 614); and after the capacitor is pre-charged, a voltage on the first terminal is less than negative three volts (e.g., −4V), and a voltage on the second terminal is greater than zero volts (e.g., 1V).

In one embodiment, when boosting the voltage on the access line, the voltage on the second terminal of the capacitor is less than negative three volts (e.g., −4V).

FIG. 8 shows exemplary voltage waveforms for the system of FIG. 6, in accordance with some embodiments. More specifically, FIG. 8 shows a graph illustrating voltages on various nodes of the system of FIG. 6 versus time. These nodes are node 618, node 620, and the boost signal provided at node 624.

The voltage waveforms are each illustrated for boost-off and boost-on phases. In the boost-off phase, boost capacitor 604 is being pre-charged. In the boost-on phase, boost capacitor 604 is boosting the voltage of access line 612.

As illustrated, during the boost-off phase, the boost signal is inactive low (e.g., zero volts). During the boost-on phase, the boost signal is active high (e.g., a positive voltage such as 4V).

During the boost-off phase, the voltage difference between nodes 618 and 620 corresponds to the voltage across the terminals of boost capacitor 604 when pre-charged. When fully pre-charged, node 618 is at a voltage of −4V, and node 620 is at a voltage of 1V. This corresponds to a 5V voltage drop across boost capacitor 604 in a fully pre-charged state.

At time T1, controller 602 causes the boost signal to transition high, which turns switch 608 on and starts the discharge of boost capacitor 604. The voltage on node 620 decreases to −4V. Switch 606 is off.

The voltage on node 618 initially decreases to −5V. As charge is pulled from access line 612 to boost capacitor 604 due to charge sharing, the voltage on node 618 increases to a final voltage of −3V at time T2. The final voltage on access line 612 at time T2 is −3V, which is sufficiently low to complete programming of the selected memory cell.

After the completion of programming, at time T2 controller 602 causes the boost signal to transition low, which turns switch 608 off and turns switch 606 on. This starts the pre-charging of boost capacitor 604 to prepare for a subsequent boost operation. At time T2, the voltage on node 620 returns to a positive voltage of 1V.

After time T2, during pre-charging (the boost-off phase as illustrated in FIG. 8), node 618 will be pulled down from −3V to a negative voltage of −4V. This occurs as the charge accumulated by boost capacitor 604 during the boost-on phase is removed by negative voltage source 616.

Figure 9:
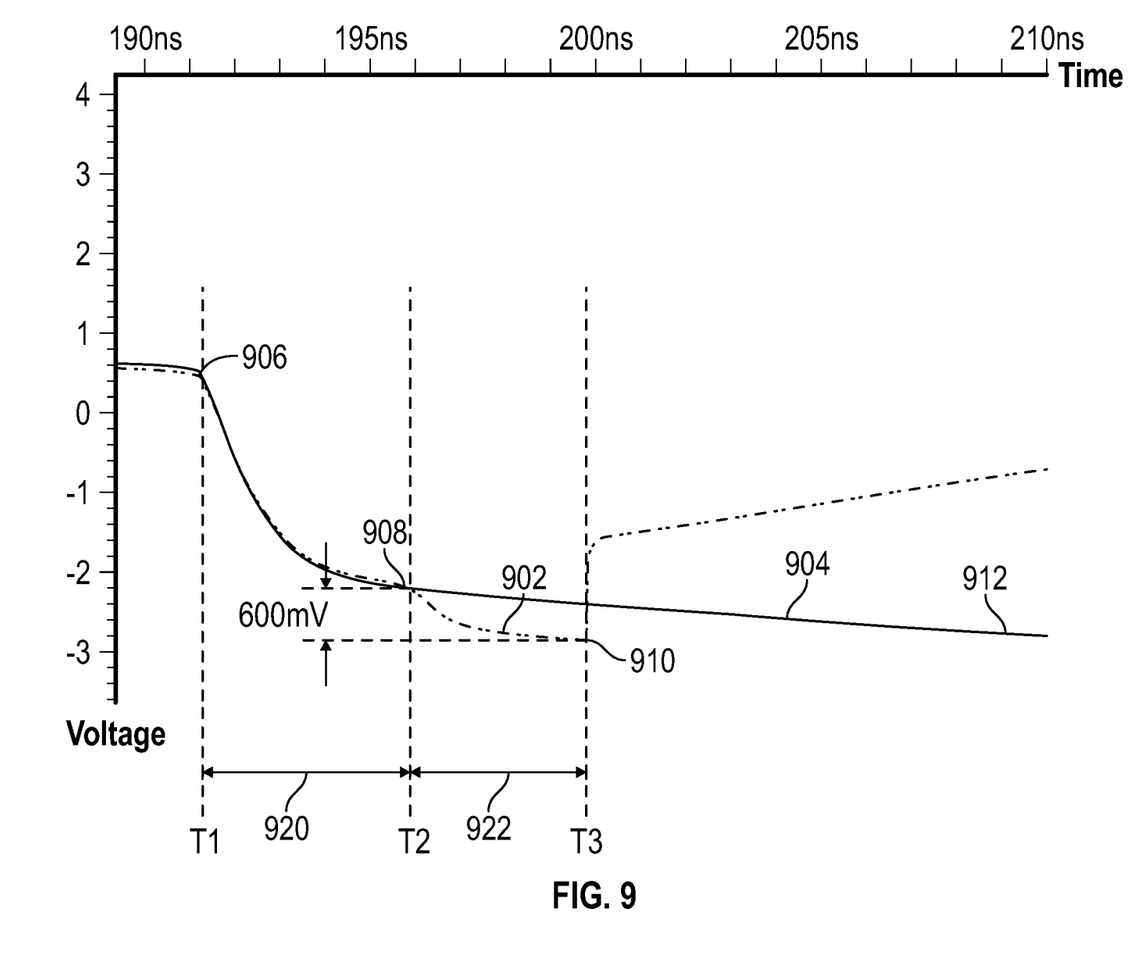
FIG. 9 shows exemplary waveforms for voltages generated on an access line, in accordance with some embodiments.

FIG. 9 shows exemplary waveforms for voltages generated on an access line, in accordance with some embodiments. In one example, the access line is access line 612 configured as a word line that is pulled to a negative voltage sufficient for programming a memory cell. Voltage waveform 904 corresponds to a voltage on the word line that occurs when a boost capacitor is not used to boost the voltage on the word line. Voltage waveform 902 corresponds to a voltage on the same word line that occurs when the boost capacitor is used to boost the voltage as described above. Each voltage waveform is shown in a graph of voltage versus time.

At time T1, bias circuitry starts to discharge the word line. This is a boost-off phase, and the boost capacitor is not connected to the word line. Each voltage waveform 902, 904 starts at an initial voltage of 906 at time T1.

At time T2, the voltage on the word line is boosted by connecting the boost capacitor to the word line. This is a boost-on phase. The voltage on the word line at time T2 is voltage 908. As illustrated, the boosted discharge of the voltage on the word line for voltage waveform 902 decreases significantly more rapidly than the voltage on the word line for voltage waveform 904, when not boosted. In one example, the word line can be boosted on some operations (e.g., write), but not on other operations (e.g., read), as decided by a controller.

In one example, during the boost-on phase, during time period 922, the voltage on the word line decreases by 600 mV. Time period 922 is, for example, less than five nanoseconds.

During time period 920, the boost capacitor is not used. The rate of voltage decrease for the word line is initially high, and then later the rate of discharge becomes significantly lower. So, the boost capacitor is typically connected after the voltage has fallen to voltage 908. However, in other embodiments, the boost capacitor can be connected at an earlier time after time T1, if desired to boost the discharge at an earlier time.

Eventually at time T3, after discharge, the voltage on boosted voltage waveform 902 reaches a final voltage 910, which is sufficiently low to complete the programming operation. In comparison, the voltage on non-boosted voltage waveform 904 does not reach a final voltage 912 that is sufficiently low for programming until a much later time than for the boosted word line.

At time T3, the boost capacitor is disconnected from the word line. This begins a boost-off phase in which the boost capacitor is pre-charged in preparation for the next access operation.

In one embodiment, a controller monitors the voltage on the word line as it decreases during time period 920. The controller determines when the voltage on the word line has fallen below a threshold level (e.g., a threshold level of −2V, or a percentage or absolute decrease in voltage from initial voltage 906). In response to determining that the voltage has fallen below the threshold level, the controller causes the boost signal to transition from inactive to active (e.g., low to high as in FIG. 8), which connects the boost capacitor to the word line (e.g., at time T2).

Various additional embodiments that use a boost capacitor to boost a voltage on an access line are now described. In one embodiment, bias circuitry starts to generate a voltage on an access line at a first time (e.g., time T1 of FIG. 9), and the voltage on the access line is boosted starting at a second time (e.g., time T2 of FIG. 9) that is later than the first time by a time period (e.g., time period 920).

In one embodiment, at least one performance characteristic (e.g., access time, programming time, access line discharge time, error rate for reads, temperature of a memory array or memory device, reliability, etc.) associated with programming memory cells of the memory array is determined. The time period (e.g., time period 920) is selected for each boost operation by a controller based on the determined performance characteristic.

In one embodiment, boosting the voltage on the access line is performed for a boost time period (e.g., time period 922). At least one performance characteristic (e.g., access time, programming time, access line discharge time, error rate for reads, temperature of a memory array or memory device, reliability, etc.) associated with programming memory cells of the memory array is determined. The boost time period is selected for each boost operation by a controller based on the determined performance characteristic.

In one embodiment, the voltage on the access line decreases by at least 300 millivolts in a time period (e.g., time period 922) of less than 5 nanoseconds when boosting the voltage on the access line.

In one embodiment, an apparatus comprises: bias circuitry (e.g., 610 of FIG. 6) configured to generate a voltage on an access line (e.g., 612) used to access a memory cell of a memory array; at least one capacitor (e.g., 604) configured to boost the voltage on the access line when accessing the memory cell; at least one switch (e.g., 608) configured to electrically connect the capacitor to the bias circuitry, wherein the switch is in an on state when the capacitor is boosting the voltage; and pre-charging circuitry (e.g., switch 606, negative voltage source 616) configured to pre-charge the capacitor, wherein the switch is in an off state when the capacitor is being pre-charged in preparation for boosting the voltage.

In one embodiment, boosting the voltage comprises lowering the voltage on the access line; and the switch electrically connects the capacitor to the bias circuitry so that the capacitor extracts charge (e.g., pulls charge from a word line that is being discharged to a negative voltage for programming a memory cell) when boosting the voltage on the access line.

In one embodiment, the charge is extracted from a parasitic capacitance (e.g., 508) of at least the bias circuitry or the memory array.

In one embodiment, the apparatus further comprises a controller (e.g., 120, 602), wherein the controller is configured to: determine that a write operation is being performed; and in response to determining that the write operation is being performed, cause the switch to change from the off state to the on state.

In one embodiment, the bias circuitry comprises discharging circuitry (e.g., 514) configured to discharge the access line when accessing the memory cell during a write operation; and the controller is further configured to start discharging the access line using the discharging circuitry prior to causing the switch to change from the off state to the on state.

In one embodiment, the discharging circuitry comprises a current mirror.

In one embodiment, the discharging circuitry is configured to use a fixed current for discharging the access line.

In one embodiment, the memory array is configured in a cross-point architecture, and the access line is a word line or bit line.

In one embodiment, the memory cell comprises a chalcogenide.

In one embodiment, the bias circuitry comprises decoders (e.g., 510) configured to select the access line, and a driver (e.g., 512) to generate a voltage on the access line.

In one embodiment, the access line is a word line or bit line, and the driver includes a current mirror configured to discharge the word line or bit line to a negative voltage for performing a write operation on the memory cell.

In one embodiment, an apparatus comprises: a capacitor (e.g., 522, 604); and a switch (e.g., 520, 608) configured to electrically connect the capacitor to bias circuitry used to generate a voltage on an access line (e.g., 502) used to access a memory cell in a memory array. The capacitor is configured to boost the voltage on the access line after the bias circuitry starts to generate the voltage. The switch is in an on state when the capacitor is boosting the voltage, and the switch is in an off state when the capacitor is being pre-charged. The apparatus further comprises pre-charging circuitry (e.g., 524) configured to pre-charge the capacitor after the capacitor has boosted the voltage on the access line.

In one embodiment, the apparatus further comprises: a controller (e.g., 602) configured to provide a control signal (e.g., boost signal of FIG. 6) that causes the switch to change from the off state to the on state when a write operation is performed to program the memory cell; and an inverter (e.g., 614) having an input to receive the control signal, and an output (e.g., at node 620) electrically connected to a first terminal of the capacitor (e.g., 604). A second terminal of the capacitor is electrically connected to a first current terminal (e.g., at node 618) of the switch (e.g., 608).

In one embodiment, a second current terminal of the switch is electrically connected to the bias circuitry (e.g., 610).

In one embodiment, the switch is a first switch (e.g., 608); and the pre-charging circuitry comprises a second switch (e.g., 606) having a control terminal electrically connected to the output (e.g., at node 620) of the inverter, a first current terminal electrically connected (e.g., at node 618) to the second terminal of the capacitor, and a second current terminal electrically connected to a negative voltage source (e.g., 616).

In one embodiment, a non-transitory computer-readable medium stores instructions which, when executed by a controller (e.g., 602), cause the controller to: receive a write command from a host device (e.g., 126); in response to receiving the write command, cause bias circuitry to generate a voltage on an access line used to program a memory cell of a memory array; after the bias circuitry starts to generate the voltage on the access line, cause a capacitor to boost the voltage on the access line; program the memory cell; and after the memory cell has been programmed, cause pre-charging circuitry to pre-charge the capacitor.

In one embodiment, a switch is configured to electrically connect the capacitor to the bias circuitry; the switch is in an on state when the capacitor is boosting the voltage; the switch is in an off state when the capacitor is being pre-charged; and causing the capacitor to boost the voltage comprises changing the switch from the off state to the on state.

In one embodiment, the instructions further cause the controller to determine whether the voltage on the access line has decreased to a threshold level. The controller causes the capacitor to boost the voltage on the access line in response to determining that the voltage has decreased to the threshold level.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "electrically connected to" or "electrically connected with" generally refers to a connection between components, which can be an indirect communicative connection (e.g., with intervening components) or direct communicative connection (e.g., without intervening components).

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
   bias circuitry electrically connected to an access line used to access a memory cell of a memory array, the bias circuitry configured to generate a voltage on the access line;
   at least one capacitor configured to boost the voltage on the access line when accessing the memory cell, wherein boosting the voltage comprises lowering the voltage on the access line;
   at least one switch configured to electrically connect the capacitor to the bias circuitry, wherein the switch is in an on state when the capacitor is boosting the voltage; and
   pre-charging circuitry configured to pre-charge the capacitor, wherein the switch is in an off state when the capacitor is being pre-charged in preparation for boosting the voltage.

2. The apparatus of claim 1, wherein:
   the switch electrically connects the capacitor to the bias circuitry so that the capacitor extracts charge when boosting the voltage on the access line.

3. The apparatus of claim 2, wherein the charge is extracted from a parasitic capacitance of at least the bias circuitry or the memory array.

4. The apparatus of claim 1, further comprising a controller, wherein the controller is configured to:
   determine that a write operation is being performed; and
   in response to determining that the write operation is being performed, cause the switch to change from the off state to the on state.

5. The apparatus of claim 4, wherein:
   the bias circuitry comprises discharging circuitry configured to discharge the access line when accessing the memory cell during a write operation; and
   the controller is further configured to start discharging the access line using the discharging circuitry prior to causing the switch to change from the off state to the on state.

6. The apparatus of claim 5, wherein the discharging circuitry comprises a current mirror.

7. The apparatus of claim 5, wherein the discharging circuitry is configured to use a fixed current for discharging the access line.

8. The apparatus of claim 1, wherein the memory array is configured in a cross-point architecture, and the access line is a word line or bit line.

9. The apparatus of claim 1, wherein the memory cell comprises a chalcogenide.

10. The apparatus of claim 1, wherein the bias circuitry comprises decoders configured to select the access line, and a driver to generate a voltage on the access line.

11. The apparatus of claim 10, wherein the access line is a word line or bit line, and the driver includes a current mirror configured to discharge the word line or bit line to a negative voltage for performing a write operation on the memory cell.

12. An apparatus comprising:
a capacitor;
bias circuitry electrically connected to an access line used to access a memory cell in a memory array, the bias circuitry configured to generate a voltage on the access line;
a switch configured to electrically connect the capacitor to the bias circuitry, the capacitor being separated from the access line, wherein:
the capacitor is configured to boost the voltage on the access line after the bias circuitry starts to generate the voltage, wherein boosting the voltage comprises lowering the voltage on the access line; and
the switch is in an on state when the capacitor is boosting the voltage, and the switch is in an off state when the capacitor is being pre-charged; and
pre-charging circuitry configured to pre-charge the capacitor after the capacitor has boosted the voltage on the access line.

13. The apparatus of claim 12, further comprising:
a controller configured to provide a control signal that causes the switch to change from the off state to the on state when a write operation is performed to program the memory cell; and
an inverter having an input to receive the control signal, and an output electrically connected to a first terminal of the capacitor;
wherein a second terminal of the capacitor is electrically connected to a first current terminal of the switch.

14. The apparatus of claim 13, wherein a second current terminal of the switch is electrically connected to the bias circuitry.

15. The apparatus of claim 13, wherein:
the switch is a first switch; and
the pre-charging circuitry comprises a second switch having a control terminal electrically connected to the output of the inverter, a first current terminal electrically connected to the second terminal of the capacitor, and a second current terminal electrically connected to a negative voltage source.

16. A non-transitory computer-readable medium storing instructions which, when executed by a controller, cause the controller to:
receive a write command from a host device;
in response to receiving the write command, cause bias circuitry to generate a voltage on an access line used to program a memory cell of a memory array, wherein the bias circuitry is electrically connected to the access line;
after the bias circuitry starts to generate the voltage on the access line, cause a capacitor to boost the voltage on the access line, wherein the capacitor is separated from the access line, wherein boosting the voltage comprises lowering the voltage on the access line;
program the memory cell; and
after the memory cell has been programmed, cause pre-charging circuitry to pre-charge the capacitor.

17. The non-transitory computer-readable medium of claim 16, wherein:
a switch is configured to electrically connect the capacitor to the bias circuitry;
the switch is in an on state when the capacitor is boosting the voltage;
the switch is in an off state when the capacitor is being pre-charged; and
causing the capacitor to boost the voltage comprises changing the switch from the off state to the on state.

18. The non-transitory computer-readable medium of claim 16, wherein the instructions further cause the controller to:
determine whether the voltage on the access line has decreased to a threshold level;
wherein the controller causes the capacitor to boost the voltage on the access line in response to determining that the voltage has decreased to the threshold level.

19. A method comprising:
receiving, by a controller, a write command;
in response to receiving the write command, causing, by the controller, bias circuitry to generate a voltage on an access line, wherein the bias circuitry is electrically connected to the access line and the access line is configured to program a memory cell of a memory array;
boosting, using a capacitor, the voltage on the access line when programming the memory cell, wherein the capacitor is separated from the access line, wherein boosting the voltage comprises lowering the voltage on the access line; and
after programming the memory cell, pre-charging the capacitor.

20. The method of claim 19, further comprising:
receiving, by the controller, an address associated with the write command; and
determining, using the address, a physical location of the memory cell;
wherein boosting the voltage on the access line is performed based on the determined physical location.

21. The method of claim 19, wherein:
a switch is configured to electrically connect the capacitor to the bias circuitry;
the switch is in an on state when the capacitor is boosting the voltage;
the switch is in an off state when the capacitor is being pre-charged; and
causing the capacitor to boost the voltage comprises changing the switch from the off state to the on state.

22. The method of claim 21, wherein:
a first terminal of the capacitor is electrically connected to the switch, and a second terminal of the capacitor is coupled to a control signal provided by the controller; and
after the capacitor is pre-charged, a voltage on the first terminal is less than negative three volts, and a voltage on the second terminal is greater than zero volts.

23. The method of claim 22, wherein when boosting the voltage on the access line, the voltage on the second terminal of the capacitor is less than negative three volts.

24. The method of claim 19, wherein the bias circuitry starts to generate the voltage on the access line at a first time, and the voltage on the access line is boosted starting at a second time that is later than the first time by a time period, the method further comprising:

determining at least one performance characteristic associated with programming memory cells of the memory array; and determining the time period based on the performance characteristic.

25. The method of claim 19, wherein boosting the voltage on the access line is performed for a time period, the method further comprising:

determining at least one performance characteristic associated with programming memory cells of the memory array; and determining the time period based on the performance characteristic.

26. The method of claim 19, wherein the voltage on the access line decreases by at least 300 millivolts in a time period of less than 5 nanoseconds when boosting the voltage on the access line.

27. The method of claim 19, wherein boosting the voltage on the access line comprises charging the access line to a positive voltage.

* * * * *